(12) United States Patent
Kuroda

(10) Patent No.: US 6,696,351 B1
(45) Date of Patent: Feb. 24, 2004

(54) SEMICONDUCTOR DEVICE HAVING A SELECTIVELY DEPOSITED CONDUCTIVE LAYER

(75) Inventor: Hideaki Kuroda, Kanagawa (JP)

(73) Assignee: Sony Corporation (JP)

( * ) Notice: Subject to any disclaimer, the term of this patent is extended or adjusted under 35 U.S.C. 154(b) by 873 days.

(21) Appl. No.: 09/056,794

(22) Filed: Apr. 8, 1998

Related U.S. Application Data

(62) Division of application No. 08/695,349, filed on Aug. 9, 1996, now abandoned.

(30) Foreign Application Priority Data

Aug. 15, 1995 (JP) .......................................... P7-208072
Apr. 4, 1996 (JP) .......................................... P8-082907

(51) Int. Cl.[7] .............................................. H01L 21/70
(52) U.S. Cl. ........................ 438/450; 438/451; 438/452; 438/453
(58) Field of Search .................... 438/450, 451, 438/452, 453, 454, 460, 482, 484; 437/52, 48, 49, 43, 65

(56) References Cited

U.S. PATENT DOCUMENTS

| | | | | |
|---|---|---|---|---|
| 4,796,081 A | * | 1/1989 | Cheung et al. ................ | 357/71 |
| 5,025,741 A | * | 6/1991 | Suwanai et al. ............... | 437/52 |
| 5,155,059 A | * | 10/1992 | Hieda ........................... | 437/52 |
| 5,371,031 A | * | 12/1994 | Gill et al. ..................... | 437/52 |
| 5,523,249 A | * | 6/1996 | Gill et al. ..................... | 437/43 |
| 5,903,053 A | * | 5/1999 | Iijima et al. ................. | 257/751 |

* cited by examiner

*Primary Examiner*—Carl Whitehead, Jr.
*Assistant Examiner*—Laura M. Schillinger
(74) *Attorney, Agent, or Firm*—Rader, Fishman & Grauer PLLC; Ronald P. Kananen

(57) ABSTRACT

A process of production of a semiconductor memory device having a memory array including memory cells and a peripheral circuit on one substrate comprising the process of forming an interlayer insulating layer covering the memory array and peripheral circuit; forming the memory cells; exposing a surface of diffusion regions in the peripheral circuit after forming the memory cells; and forming a covering conductive layer on the exposed region of the diffusion regions in peripheral circuit.

A semiconductor memory device produced by such a process has memory area having a good data retention due to a low junction leakage in the diffusion regions of the memory cells, whereas it has a high processing speed peripheral circuit due to a low resistance of the diffusion regions of the peripheral circuit.

8 Claims, 18 Drawing Sheets

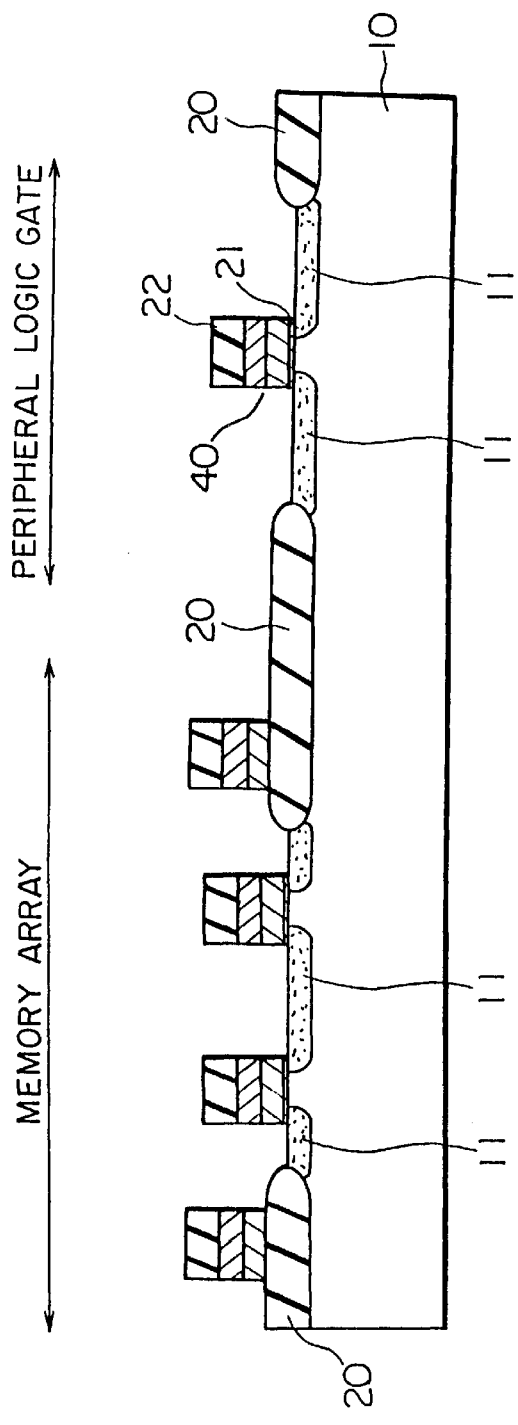
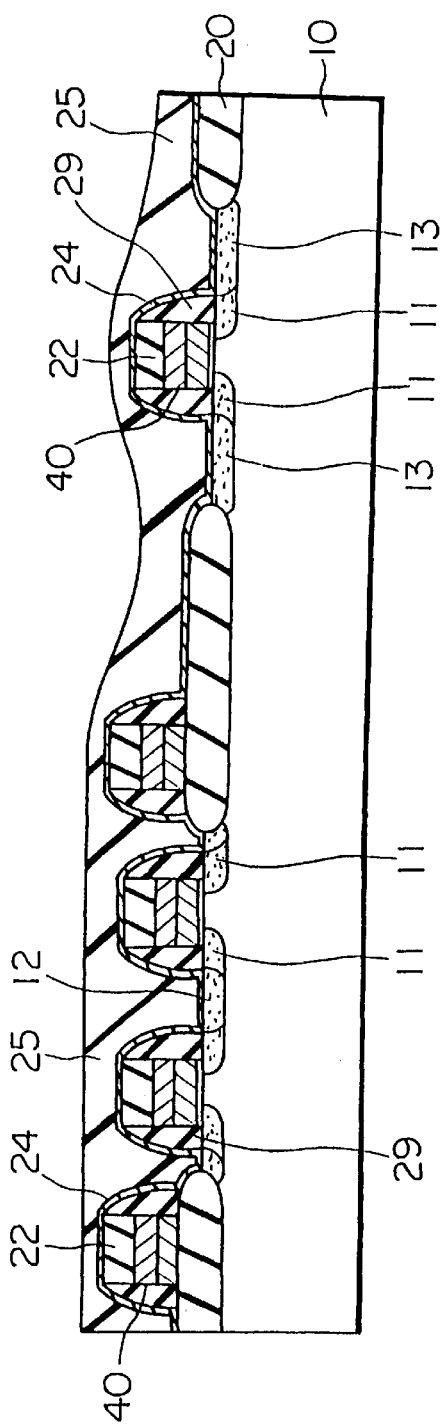

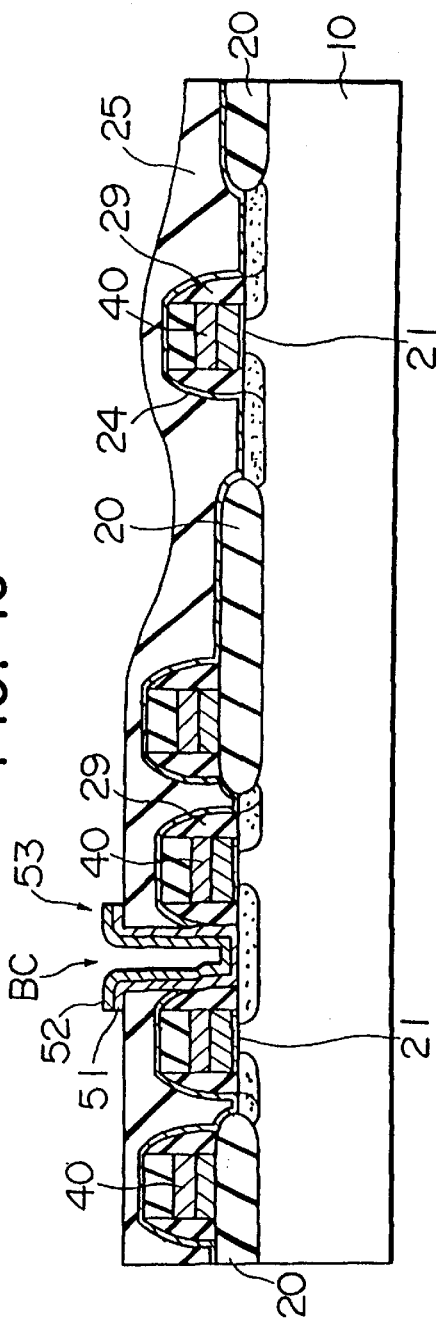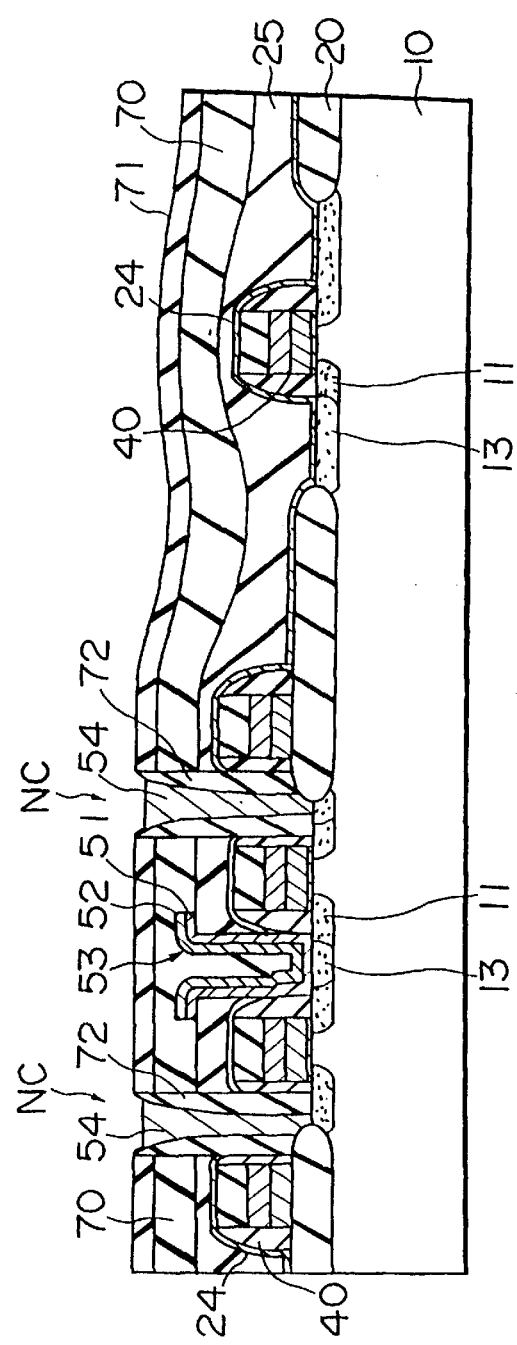

SEMICONDUCTOR DEVICE HAVING A SELECTIVELY DEPOSITED CONDUCTIVE LAYER

This application is a divisional of application Ser. No. 08/695,349 filed Aug. 9, 1996, now abandoned.

BACKGROUND OF THE INVENTION

1. Field of the Invention

The present invention relates to a semiconductor integrated circuit device having a memory array such as a dynamic random access memory (DRAM) and a peripheral circuit such as a logic circuit and to a method of making the same.

2. Description of the Related Art

In order to process and display video signals at a high speed for a personal computer or a game machine, there is a demand for a one-chip semiconductor device having a high speed logic integrated circuit and a high capacity DRAM. This is to avoid a reduction of the processing speed. A two-chip type device composed of a DRAM chip and a logic IC chip has the disadvantage of not being able to send a large amount of data simultaneously between the DRAM and logic IC due to the limits imposed by its bus width.

On another matter, in the future, it will be necessary to lower the resistance of the diffusion regions using the self-aligned silicide technique to improve the performance of the logic integrated circuit.

However, in the silicidation of the metal oxide semiconductor (MOS) switching transistor of a DRAM, there is the problem that the heat treatment for forming the bit lines after forming the self-aligned silicide and the heat treatment at the time of making the capacitors cause an increase of the resistance of the silicidated diffusion regions and greater junction leakage.

SUMMARY OF THE INVENTION

It is the object of the invention to provide a semiconductor device having a memory array such as a DRAM and a peripheral circuit such as a logic circuit which can improve the processing speed of the peripheral circuit without decreasing the data retention of the memory array.

According to one aspect of the invention, there is provided a semiconductor memory device comprising a memory array including memory cells; a peripheral circuit; and a covering conductive layer formed on the diffusion regions of the peripheral circuit but not formed on the diffusion regions of the memory array.

Also, according to another aspect of the invention, there is provided a process of production of a semiconductor memory device having a memory array including memory cells and a peripheral circuit on a single substrate comprising the process of forming an interlayer insulating layer covering the memory array and peripheral circuit; forming the memory cells; exposing the surfaces of the diffusion regions in the peripheral circuit after forming the memory cells; and forming a covering conductive layer on the exposed regions of the diffusion regions.

More specifically, the semiconductor device of the present invention has field effect transistors in the memory array and field effect transistors in the peripheral circuit, formed on the same substrate, has a covering conductive layer consisting for example of a metal or a metal alloy formed on the surface of the diffusion regions of the field effect transistors in the peripheral circuit, and does not have such a covering conductive layer on the surface of the diffusion regions of the field effect transistors forming the memory cells.

Therefore, since the memory cells are connected to diffusion regions not having a conductive layer such as a silicide, the semiconductor device of the present invention does not have the disadvantage of an increase of the junction leakage in the memory cells. Since the covering conductive layer is only formed on the diffusion regions of the transistors not comprising memory cells, the diffusion regions of the semiconductor device of the invention have a low resistance, so enable a high processing speed of the logic circuit and enable a high performance DRAM and a logic circuit having a high processing speed to be provided in a single chip device without any decrease of either performance.

According to the process for producing a semiconductor device of the invention, the peripheral circuit is covered by the interlayer insulating layer, the memory cells are formed, then the surface of the diffusion regions in the peripheral circuit is exposed, and a covering conductive layer is formed on the exposed diffusion regions in the peripheral circuit.

Therefore, since the memory cells are formed in diffusion regions with no covering conductive layer such as a silicide, the semiconductor device according to the process of the present invention does not have the disadvantage of an increase of the junction leakage in the memory cells. Since the covering conductive layer is formed on the diffusion regions of the peripheral circuit after forming the memory cells, there is no disadvantage of an increase of the resistance of the covering conductive layer, for example a silicide, due to the heat treatment at the time of forming the capacitors of the memory cells. Thus the semiconductor device of the process of the present invention exhibits a good data retention of the memory cells and a high processing speed in the peripheral circuit.

BRIEF DESCRIPTION OF THE DRAWINGS

These and other objects and features of the present invention will become clearer by the following description of the present invention made with reference to the accompanying drawings, in which:

FIG. 4A is a sectional view of a process of manufacturing a semiconductor device of a second embodiment of the present invention;

FIG. 4B is a sectional view of a process of manufacturing a semiconductor device of the second embodiment of the present invention after the step of FIG. 3A;

FIG. 4C is a sectional view of a process of manufacturing a semiconductor device of the second embodiment of the present invention after the step of FIG. 3B;

FIG. 4D is a sectional view of a process of manufacturing a semiconductor device of the second embodiment of the present invention after the step of FIG. 3C;

DESCRIPTION OF THE PREFERRED EMBODIMENTS

Before describing the preferred embodiments of the present invention, the related art will be described for background using the drawings.

Figure 1A:
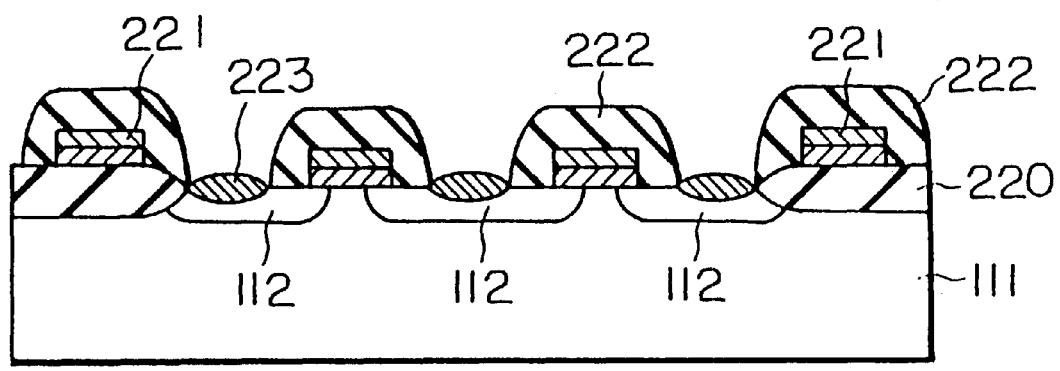
FIG. 1A is a sectional view of a conventional process of manufacturing a capacitor using a silicide.

The manufacturing process of a conventional stack type DRAM having silicide will be described. At first, as shown in FIG. 1A, a field oxide (LOCOS) layer 220 is formed on a surface of a substrate 111, then gate electrodes are formed by depositing a polysilicon silicide and insulating layer and patterning. LDD diffusion regions 112 are produced by ion implantation. Next, an oxide layer is deposited, then etched back to form sidewalls and cover the gate electrodes by an insulating layer. Then, ion implantation is conducted to produce sources and drains, then the diffusion regions are exposed. The silicide layer 223 is formed by depositing titanium and annealing in the diffusion regions.

Figure 1B:
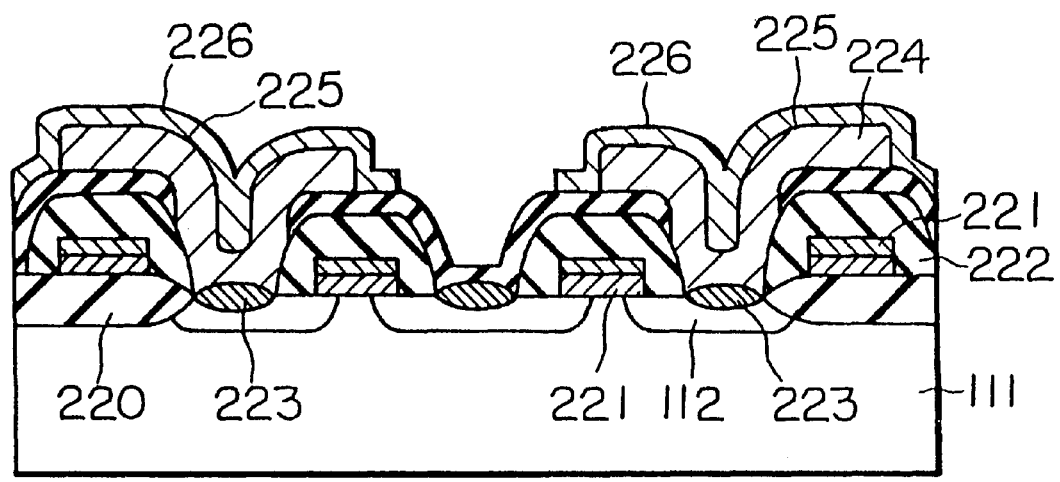
FIG. 1B is a sectional view of a conventional process of manufacturing a capacitor using a silicide after the step of FIG. 1A.

Next, as shown in FIG. 1B, a doped polycrystalline silicon layer 224 which will form the lower electrodes is deposited, then annealing is conducted at about 800° C. for 10 minutes with N2 gas. The lower electrodes are patterned, then rapid thermal annealing is conducted at 900° C. for 1 minute in an ammonia atmosphere. Then, silicon nitride is deposited by chemical vapor deposition (CVD) (about 700° C.), then this silicon nitride is oxidized for example at 850° C. for 10 minutes in $H_2+O_2$ to thereby form the insulating layer (ONO layer) 225. The doped polycrystalline silicon layer 226 for the upper electrodes is deposited by CVD, then this layer is annealed. The stack type DRAM shown in FIG. 2B results from patterning this layer 226.

If the capacitors of a DRAM are formed after silicidation of the diffusion regions, the heat treatment at the time of forming the capacitors, which runs as high as about 800° C. (in the above example, the overall heat treatment is conducted at about 850° C. for 50 minutes) causes an increase of the resistance of the silicide layer of the diffusion regions or an increase of the junction leakage. Therefore when combining a DRAM with a high processing speed logic device, the DRAM has poor retention.

In order to obtain a logic device of a high processing speed as well as controlling the increase of the junction leakage in the DRAM, a process for producing a device having both a logic circuit of a low resistance in the diffusion regions and a DRAM with no silicide layer in the diffusion regions should be provided.

Figure 2:
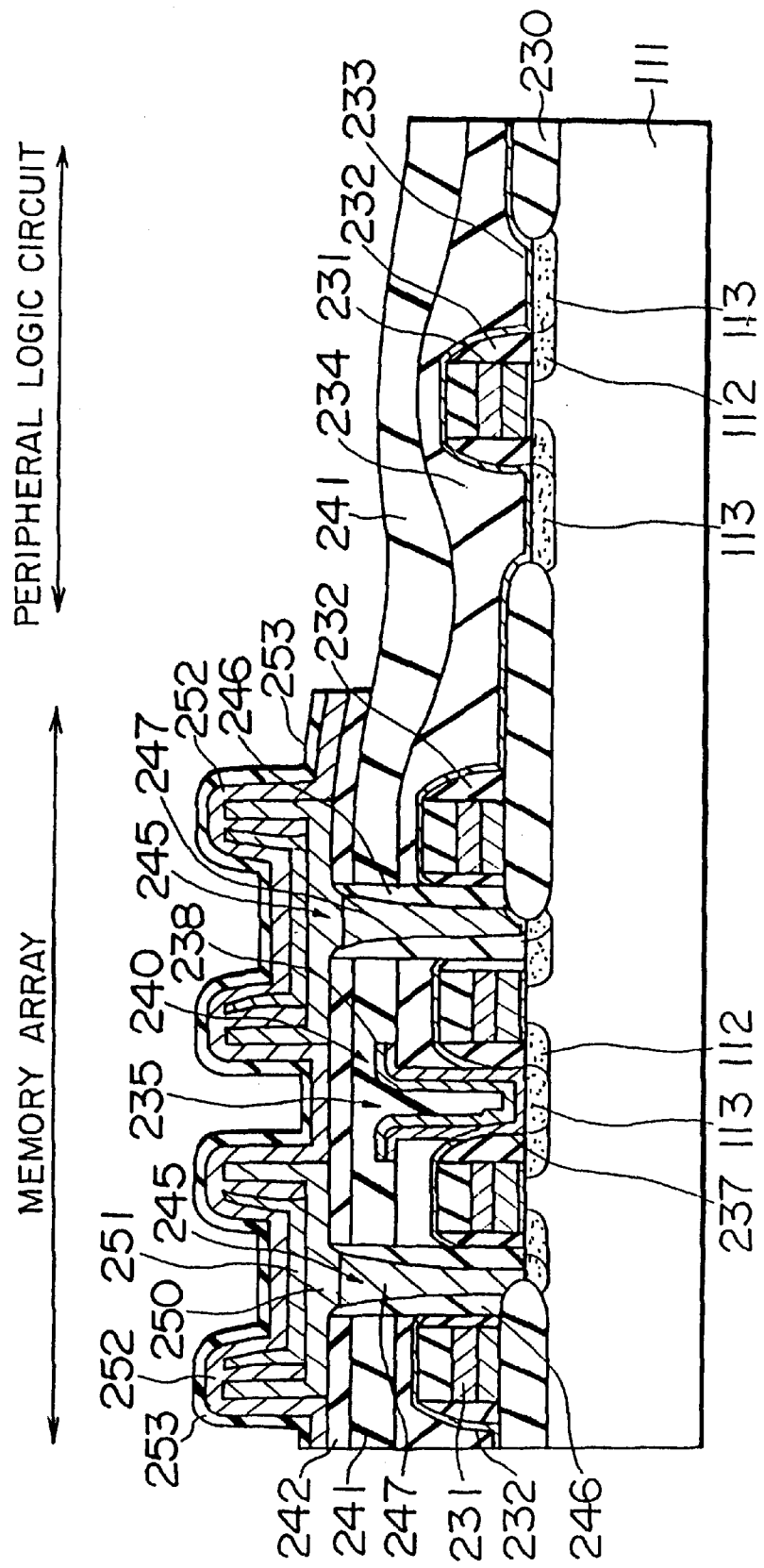
FIG. 2 is a sectional view of a conventional logic device having a DRAM.

FIG. 2 shows a cross-section of an integrated circuit having a stack type DRAM and a logic circuit on a single-chip substrate. This DRAM is a capacitor-over-bit-line type (COB), while the capacitor is a double cylinder type.

The conventional process for manufacturing the semiconductor device in shown in FIG. 2 will be described briefly next. A field oxide layer 230 is grown by the conventional LOCOS method on a substrate 111, then a gate oxide layer is formed in the active area. The gate electrodes 231 are formed by depositing a polycrystalline silicon layer, tungsten silicide layer, and silicon oxide layer successively and patterning. Then an LDD is produced by ion implantation of n-type impurities using the gate electrodes 231 and the field oxide layer 230 as a mask. Side walls 232 are formed by depositing a thick silicon oxide layer and etching back. Sources and drain 113 are produced by ion implantation. Next, a silicon nitride layer is deposited and a borophosphosilicate glass (BPSG) layer 234 is deposited, then the surface of this BPSG layer 234 is flattened. Bit contact holes 235 are made, then bit lines 240 are formed by depositing impurity-doped polycrystalline silicon 237 and tungsten silicide 238 and patterning. A BPSG layer 241 is deposited and flattened, then the silicon nitride layer 242 is deposited. The memory node contact holes 245 are made, then side walls of silicon oxide 246 are formed on the inner walls of the memory node contact holes 245, then the holes are filled with polycrystalline silicon 247. A BPSG layer is deposited to a thickness of hundreds of nm and grooves with a memory node shape are formed in the BPSG layer by etching the BPSG layer using the silicon nitride as an etching stopper layer. Next, the impurity doped polycrystalline silicon layer 250 is deposited, then the side walls on the walls of the grooves are formed by this etching back this layer. Then a polycrystalline silicon layer 251 and silicon oxide layer are deposited successively, then the polycrystalline silicon layer 250 is exposed by etching back the silicon oxide to etch the same. Thereafter, the silicon oxide layer including the exposed side walls is removed, whereby double cylinder type memory nodes are accomplished. Then an ONO layer is formed on the surface of the polycrystalline silicon layer. Plate electrodes are formed by depositing a polycrystalline silicon layer and silicon oxide layer successively and patterning, whereby the one-chip DRAM seen in FIG. 2 is achieved.

Such a manufacturing process needs heat treatment, for example, corresponding to annealing over 850° C. for over 1 hour, to form the bit lines of a DRAM. Therefore, if silicide is formed in the logic transistors, since the DRAM is formed after the formation of the silicide, a problem of an increase of resistance in the self-aligned silicide diffusion regions and junction leakage will occur.

Next, preferred embodiments of the present invention will be described with reference to the drawings.

A process of manufacturing a semiconductor device having both a DRAM having a fin type memory node and a peripheral circuit having silicide in the diffusion region of the MOS transistors according to a first embodiment will be described referring to FIG. 3A to FIG. 3F.

Figure 3A:
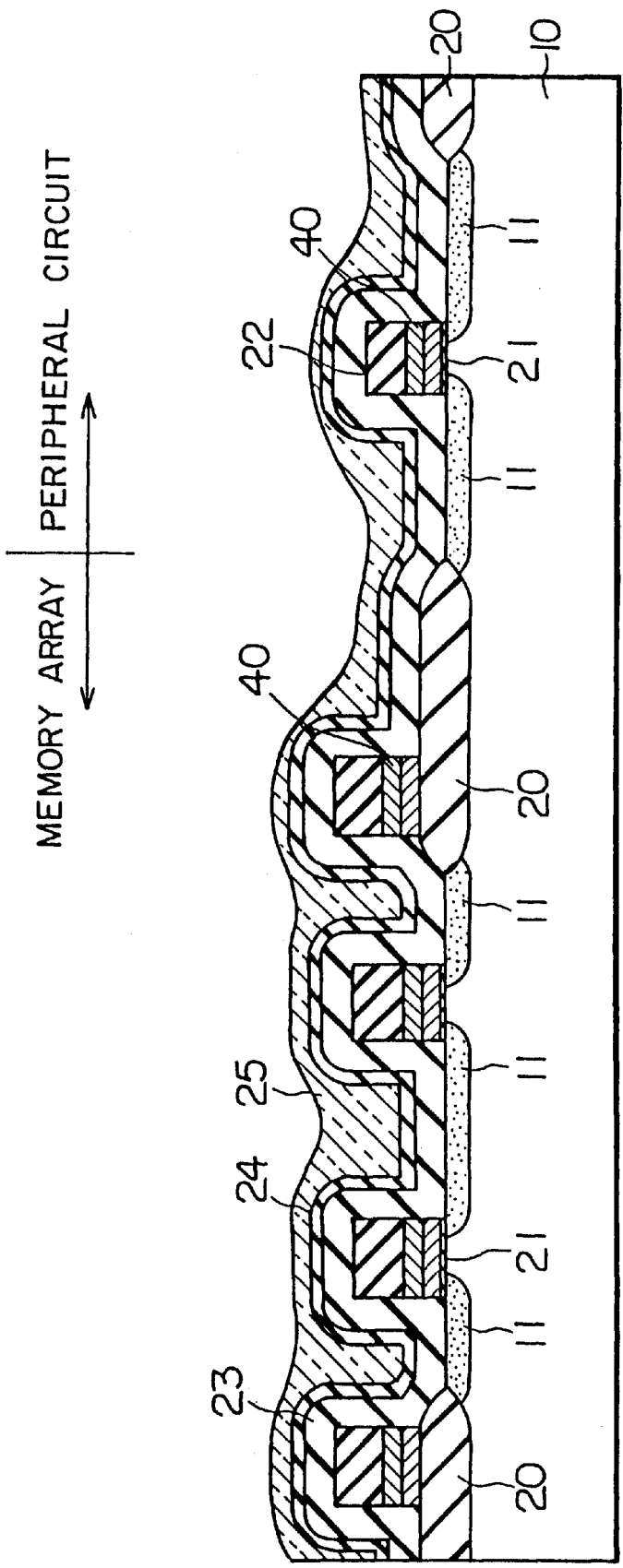
FIG. 3A is a sectional view of a process of manufacturing a semiconductor device of a first embodiment of the present invention.

First, as shown in FIG. 3A, a field oxide (LOCOS) layer 20 is formed by patterning silicon nitride on a substrate 10 and heat oxidation. The gate oxide layer 21 is formed, then a gate electrode layer 40 and an offset silicon oxide layer 22 are formed by depositing a tungsten polysilicon silicide layer and a silicon oxide layer to a thickness of hundreds of nm successively by CVD and patterning. Then, impurities are implanted to form the LDD diffusion regions 11. Silicon oxide is deposited to a thickness of hundreds of nm by CVD, then a silicon nitride layer 24 is formed to a thickness of hundreds of nm by LPCVD, then a BPSG layer 25 is formed to a thickness of hundreds of nm by CVD successively. Causing the BPSG layer 25 to reflow at 800 to 900° C. produces the configuration shown in FIG. 3A.

According to this embodiment, next the step of forming the memory cells is started in the state with the MOS transistors for the peripheral circuit covered by an insulating layer such as a silicon oxide layer 23, a silicon nitride 24, and a BPSG layer 25. The side walls of the transistors for the peripheral circuit will be formed later.

Figure 3B:
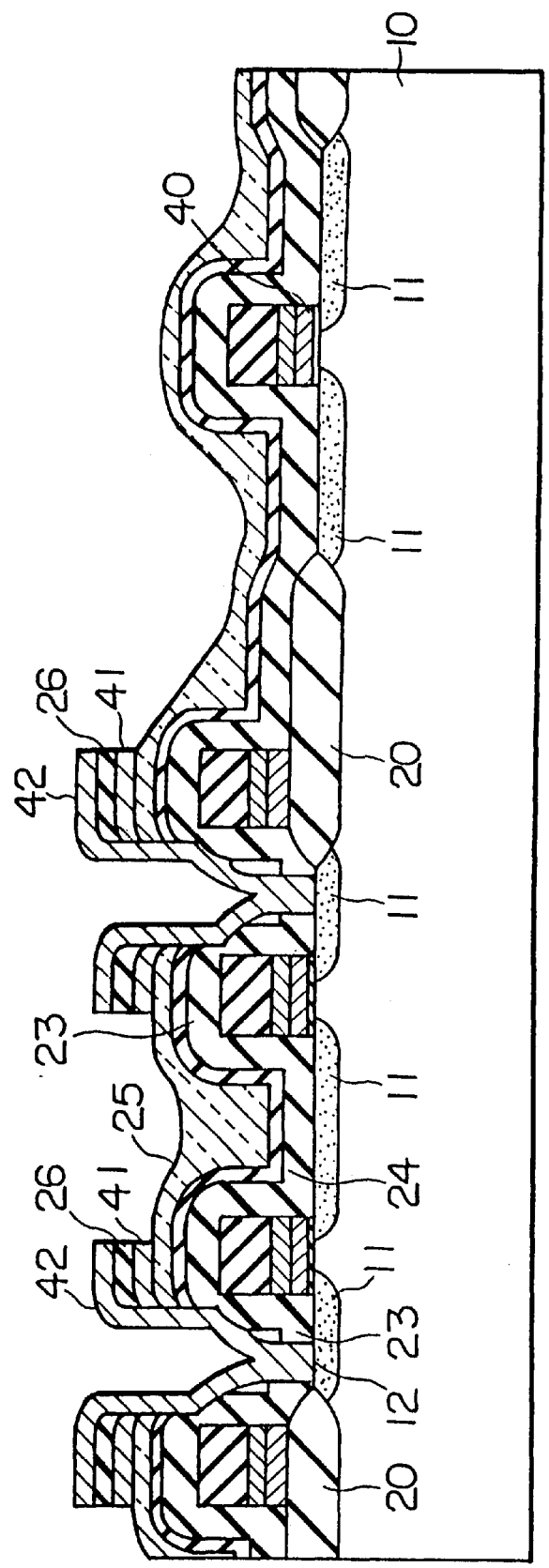
FIG. 3B is a sectional view of a process of manufacturing a semiconductor device of the present invention after the step of FIG. 3A.

Referring to FIG. 3B, impurity-doped polycrystalline silicon layer 41 is deposited to a thickness of tens of nm and a silicon oxide layer 26 is deposited to a thickness of tens of nm by CVD. A photoresist layer for forming memory node contact holes is applied and used as a mask to successively etch the silicon oxide layer 26, polycrystalline silicon layer 41, BPSG layer 25, silicon nitride layer 24, and silicon oxide layer 23 to form the memory node contact holes 12. In this case, when etching the BPSG layer 25 and silicon oxide layer 23, the silicon nitride layer 24 is etched with a high selectivity ratio. Then, an impurity-doped polycrystalline silicon layer 42 is formed by CVD, whereby this polycrystalline silicon layer 42 is connected to the polycrystalline silicon layer 41 and LDD 11 electrically. A photoresist layer for the memory nodes is patterned and used as a mask to successively etch the polycrystalline silicon layer 42, silicon oxide layer 26, and polycrystalline silicon layer 41 anisotropically. By this, the lower electrodes comprising part of the fin-type stack type memory nodes are formed.

Figure 3C:
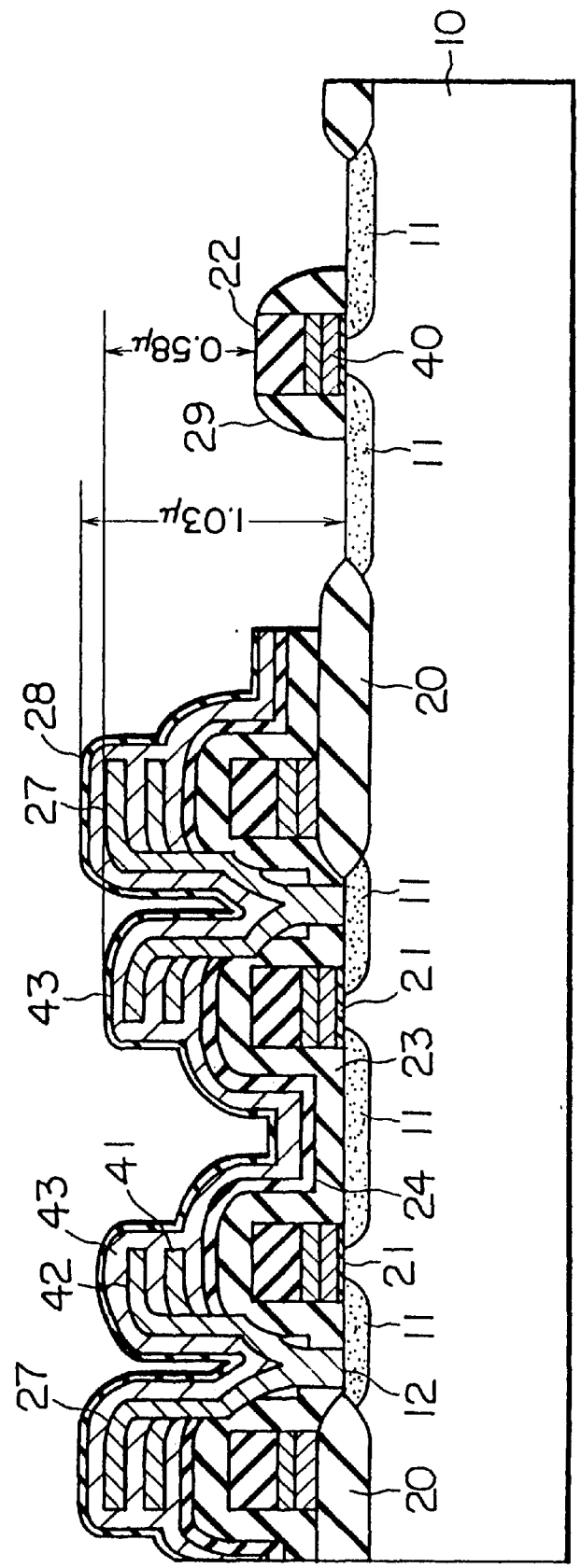
FIG. 3C is a sectional view of a process of manufacturing a semiconductor device of the present invention after the step of FIG. 3B.

Referring to FIG. 3C, the silicon oxide layer 26 and BPSG layer 25 existing between the polycrystalline silicon layers 42 and 41 comprising the lower electrodes are wet-etched with a hydrofluoric solution using the silicon nitride layer 24 as an etching stopper. The fin-type lower electrodes and memory nodes are exposed in this wet-etching process. Rapid thermal annealing is performed for example at 900° C. for 1 minute in an ammonia gas atmosphere. Next, a silicon nitride layer is deposited by CVD at about 700° C., then this silicon nitride layer is oxidized, for example, at 850° C. for 10 minutes in $H_2+O_2$, whereby an ONO layer 27 is created on the surface of the memory nodes. Then an impurity-doped polycrystalline silicon layer 43 is deposited for forming the upper electrodes and a silicon nitride layer is deposited by LPCVD successively at a thickness of tens of nm. A photoresist layer for the plate electrodes is patterned. The resist is used as a mask to etch the silicon nitride layer 28 and polycrystalline silicon layer 43. In this case, the silicon oxide layer 26 between the silicon nitride layers 42 and 41 can be left as it is and the BPSG layer 25 can be etched after forming the upper electrodes.

In this process of the first embodiment, the patterned photoresist layer is not removed but is left, then anisotropic etching is performed on the silicon nitride layer 24 and silicon oxide layer 23. Thus, as shown in FIG. 3C, the capacitors of the DRAM are completed and side walls are formed on each side of the gate electrodes 40. Furthermore, the surface of the source and drain regions in the peripheral circuit in the substrate 10 are exposed. In this case, after the photoresist layer is removed, the diffusion regions may be exposed by etching the insulating layer in the peripheral circuit using the upper electrodes as a mask.

Figure 3D:
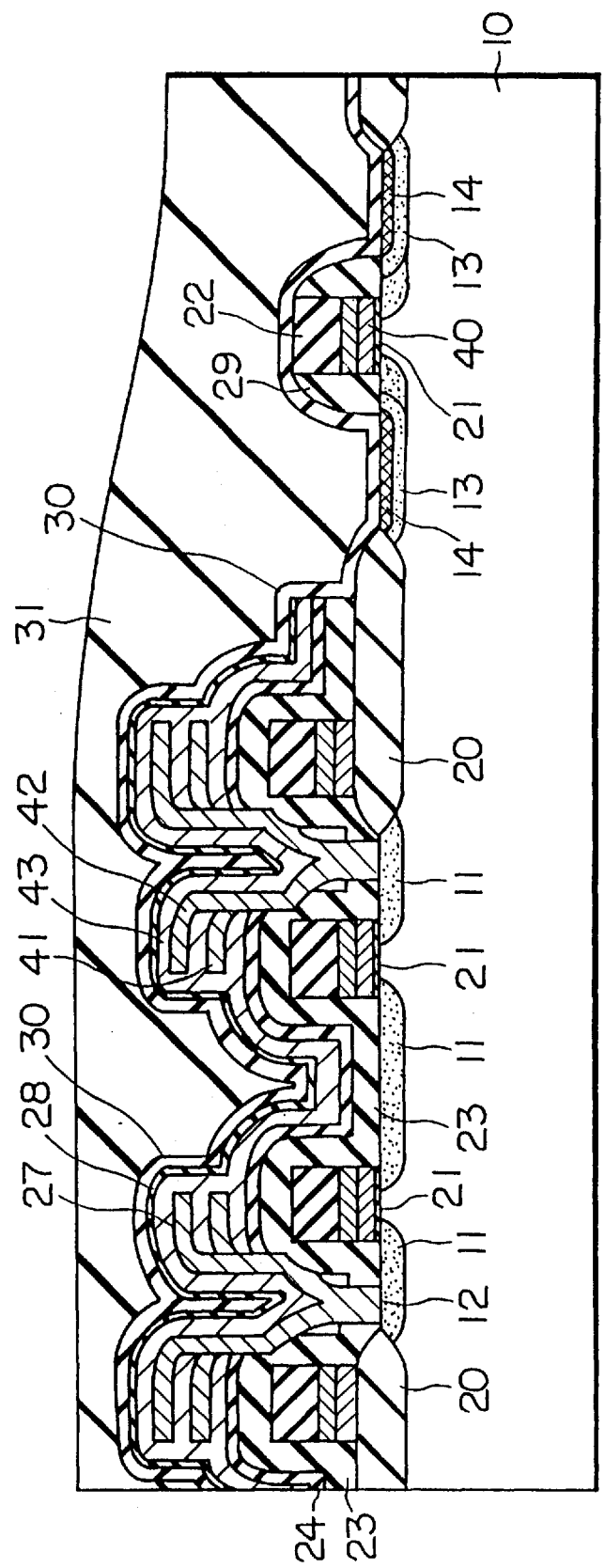
FIG. 3D is a sectional view of a process of manufacturing a semiconductor device of the present invention after the step of FIG. 3C.

Then, as shown in FIG. 3D, impurities are implanted and annealing performed to form source and drain regions 13. A silicide layer, that is, the covering conductive layer 14, is formed by sputtering a refractory metal such as titanium to a thickness of tens of nm and performing thermal annealing at 650 to 850° C. with a lamp. The titanium which did not react and remains on the silicon oxide layer is etched off with a solution including $H_2O_2$. Then, a silicon nitride layer 30 is deposited by LPCVD to a thickness of tens of nm and a silicon oxide layer 31 is deposited by CVD to a thickness of hundreds of nm. The silicon oxide layer 31 is flattened because in this embodiment, a great difference in level may be created due to exposure of the surface of the peripheral circuit after forming the capacitors. For example, as shown in FIG. 3C, the difference between the top surface of the capacitor of a DRAM and the surface of the substrate may be about 1.03 $\mu$m, the difference between the top surface of the insulating layer of the transistors in the peripheral circuit and top surface of the capacitor of the DRAM may be about 0.58 $\mu$m.

Figure 3E:
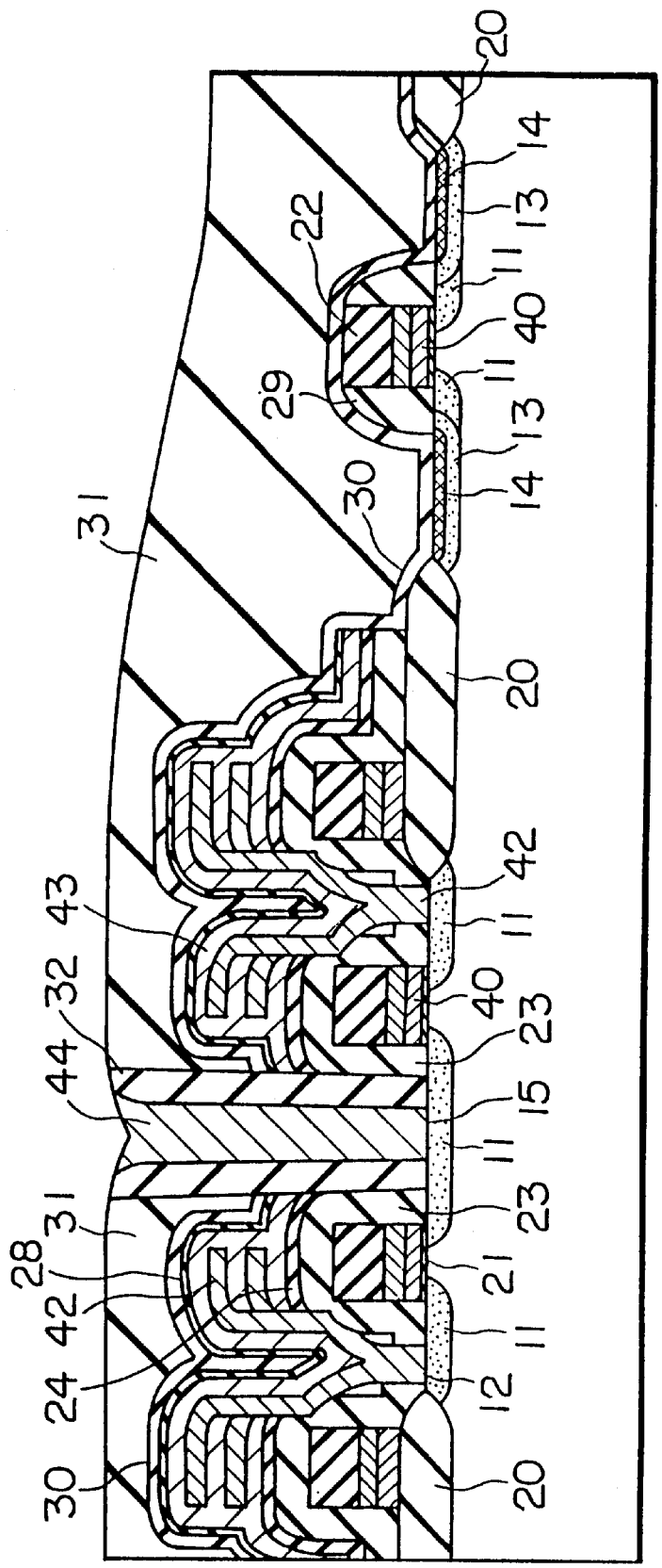
FIG. 3E is a sectional view of a process of manufacturing a semiconductor device of the present invention after the step of FIG. 3D.

Next, as shown in FIG. 3E, a photoresist layer for forming bit contact holes of the DRAM is patterned and the silicon oxide layer 31, silicon nitride layer 30, silicon nitride layer 28, polycrystalline silicon layer 43 for the upper electrodes, silicon nitride layer 24, and silicon oxide layer 23 are successively anistropically etched to form the bit contact holes 15. Side walls 32 are formed on the inner walls of the bit contact holes 15 by depositing a silicon oxide layer by CVD to a thickness of hundreds of nm and etching it back. The side walls isolate the bit contact holes 15 from the plate electrodes. A phosphorus-doped polycrystalline silicon layer 44 is deposited on the bit contact portion by CVD and then etched back to bury the bit contact holes 15.

Figure 3F:
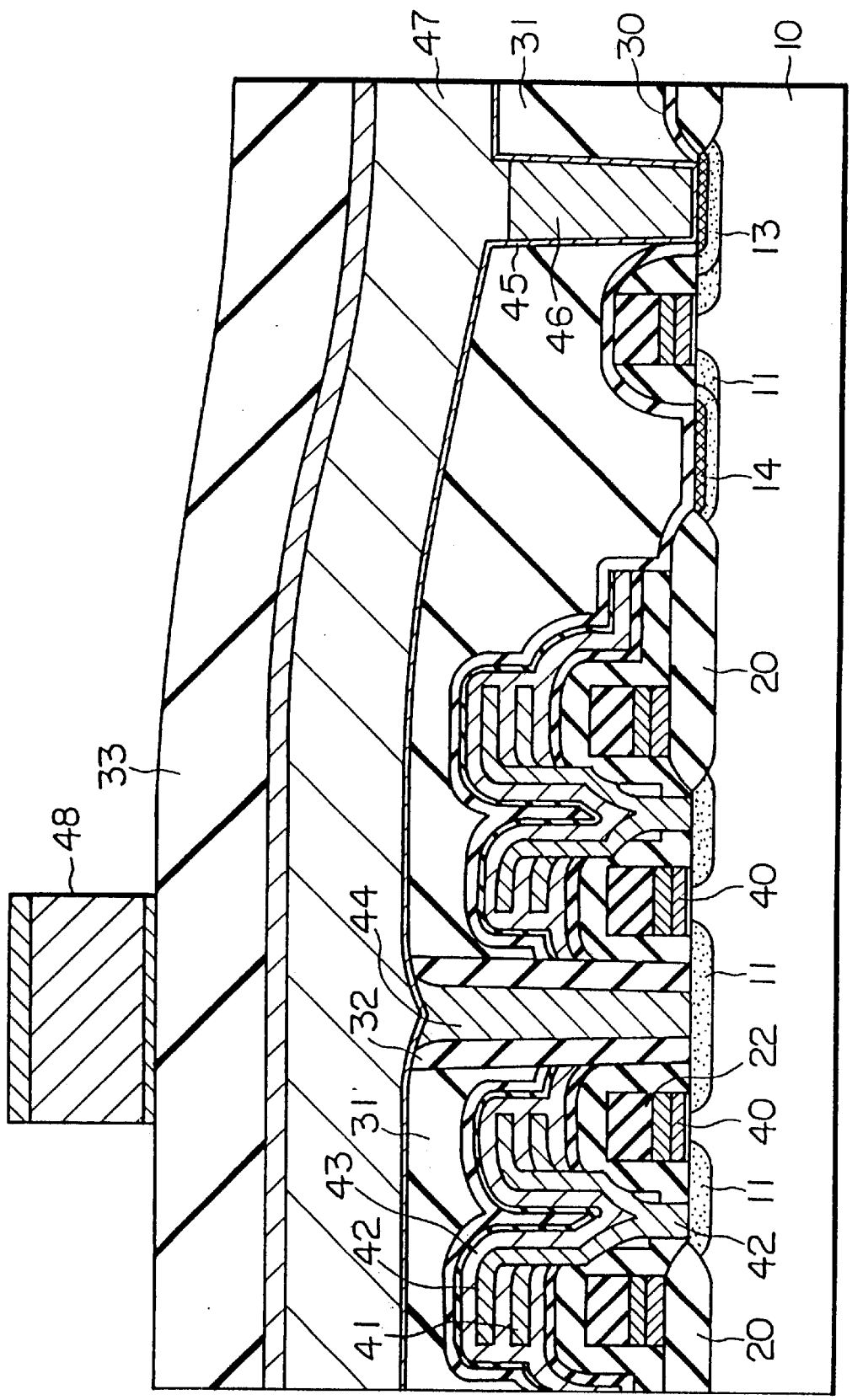
FIG. 3F is a sectional view of a process of manufacturing a semiconductor device of the present invention after the step of FIG. 3E.

As shown in FIG. 3F, a photoresist layer for forming the contact holes is patterned and the silicon oxide layer 31 and silicon nitride layer 30 are anisotropically etched to form the contact holes. A barrier metal 45 is deposited, then the contact holes are filled with blanket tungsten 46 formed by depositing and etching back tungsten. Then, a 1 Al interconnection 47, an insulating layer 33, and a 2 Al interconnection 48 are formed to complete a device having a DRAM.

According to the first embodiment, since the silicide is not formed in the diffusion regions of the memory cells, but only formed in those of the peripheral circuit, a low resistance and therefore a high processing speed of the peripheral circuit such as a logic circuit are achieved and a good retention of the DRAM is secured. Further, since the silicide in the peripheral circuit is formed only after forming the memory cells which require heat treatment and the flattening is performed by chemical mechanical polishing without reflow of the BPSG which needs heat treatment, the silicide is not affected by any heat treatment, so has a low resistance. When exposing the diffusion regions in the peripheral circuit by etching back the insulating layer, side walls are formed on each side of the gate electrodes, therefore the process is simplified.

A process of manufacturing a semiconductor device having COB type DRAM cells, where the capacitors are composed of double cylinder type memory nodes and a burying metal layer which fills grooves formed in the insulating layer as a covering conductive layer is provided in the diffusion regions of the MOS transistors of the logic circuit, according to a second embodiment will be described next.

First, as shown in FIG. 4A, a field oxide layer 20 is formed on a substrate 10 by forming and patterning a pad oxide layer and silicon nitride layer and oxidizing by heat treatment. A gate oxide layer 21 is formed by heat treatment of the substrate, then an impurity-doped polycrystalline silicon layer, a tungsten silicide layer, and a silicon oxide layer are deposited to thicknesses of hundreds of nm and patterned to form gate electrodes 40 and an offset insulating layer 22 on the gate electrodes 40. Arsenic or phosphorus ions are implanted, for example, at an acceleration voltage of tens of keV at a dosage of $1 \times 10^{12}$ to $1 \times 10^{14}$ to form LDD regions 11.

Then, as shown in FIG. 4B, side walls 29 are formed on the sides of the gate electrodes 40 by depositing silicon oxide to a thickness of tens of nm to hundreds of nm and etching back. Ions are implanted so as to form source and drain regions 13. Next, a silicon nitride layer 24 is deposited by LPCVD to a thickness of tens of rn, a BPSG layer 25 is deposited by LPCVD to a thickness of hundreds of nm, and the BPSG layer 25 is flattened by reflow or chemical mechanical polishing.

Then, as shown in FIG. 4C, bit contact holes BC are formed by photoresist patterning and reactive ion etching. The contact holes BC are covered by depositing impurity-doped polycrystalline silicon 51 and tungsten silicide 52 to a thickness of tens of nm and patterning is performed to form the bit lines 53.

Next, as shown in FIG. 4D, a BPSG layer 70 is deposited by CVD to a thickness of hundreds of rn, then is flattened by reflow or chemical mechanical polishing, then a silicon nitride layer 71 is deposited by LPCVD to a thickness of tens of nm. Next, memory node contact holes NC are formed, then side walls are formed as an insulating layer on the inner walls of the contact holes NC by depositing a silicon oxide layer and etching back. Then, the contact holes NC are filled with polycrystalline silicon plugs 54 by depositing polycrystalline silicon and etching back.

Figure 4E:
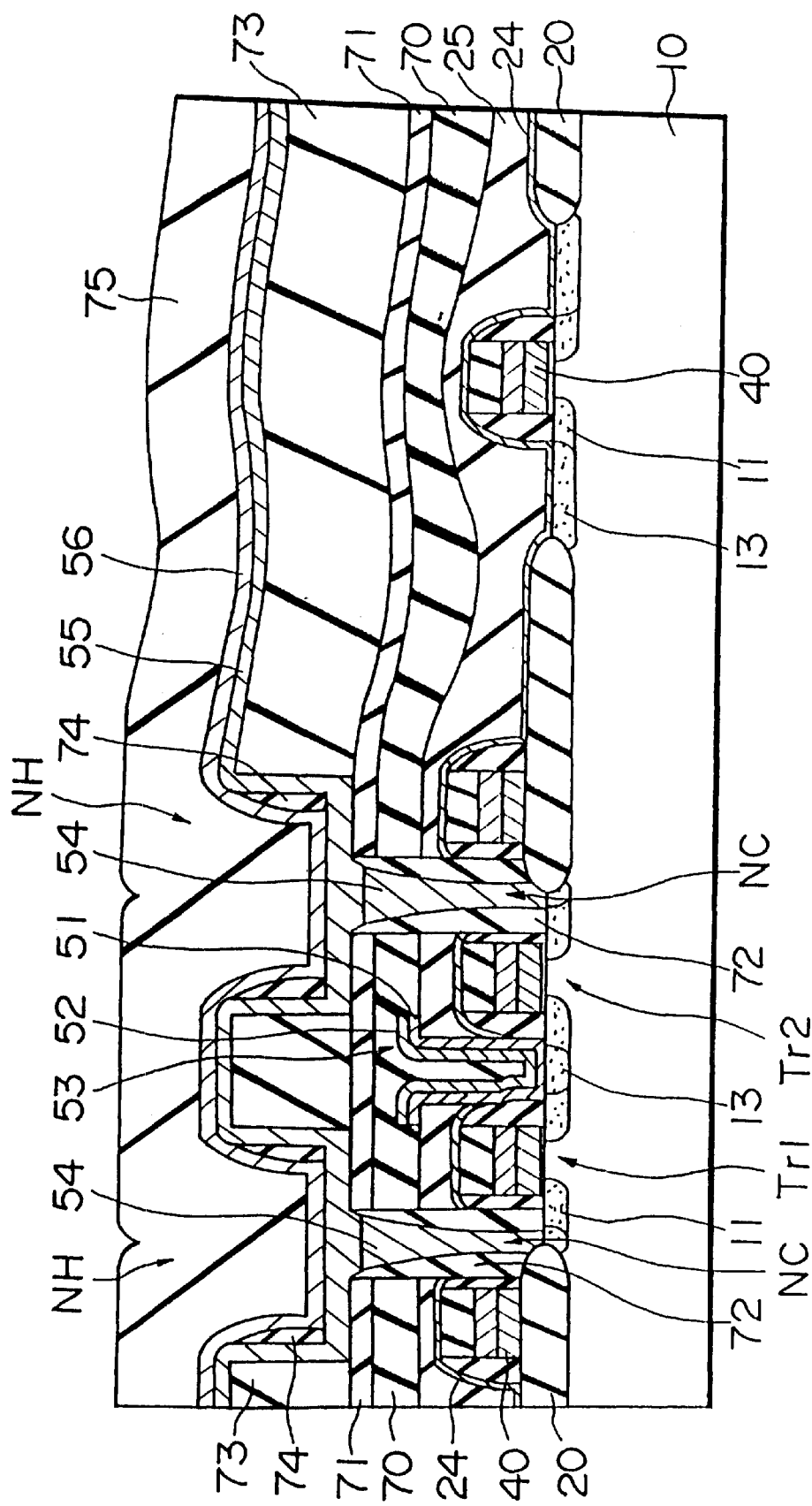
FIG. 4E is a sectional view of a process of manufacturing a semiconductor device of the second embodiment of the present invention after the step of FIG. 3D.
Figure 4F:
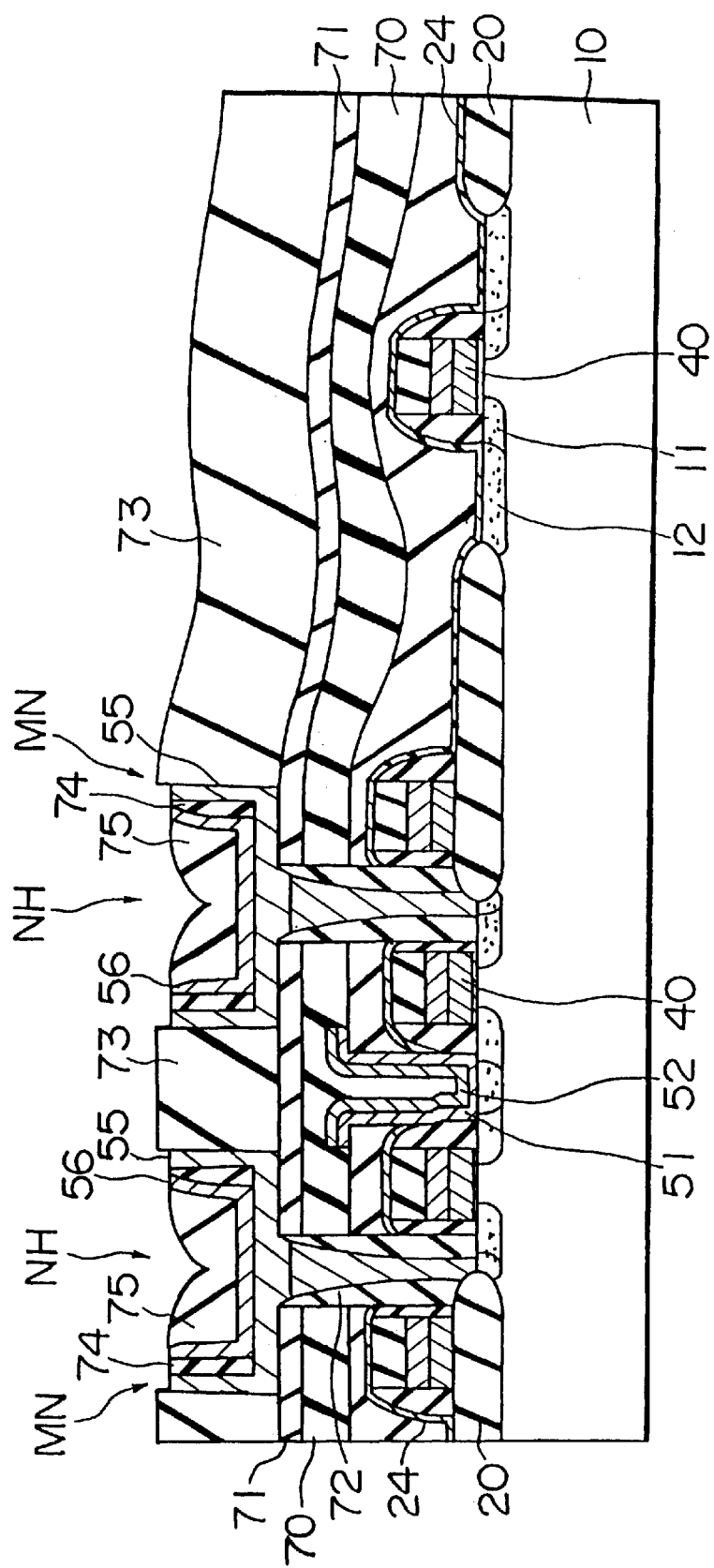
FIG. 4F is a sectional view of a process of manufacturing a semiconductor device of the second embodiment of the present invention after the step of FIG. 3E.

Then, as shown in FIG. 4E, a BPSG layer or NSG layer 73 is deposited to a thickness of hundreds of nm. Grooves NH which will form the memory nodes are formed in the insulating layer 73 by reactive ion etching of the insulating layer 73 using the silicon nitride layer 71 as an etching stopper and using a photoresist patterned corresponding to the shape of a memory node as a mask so as to expose the surface of the polycrystalline silicon plugs 54 which will connect the lower electrodes.

Then, an impurity-doped polycrystalline silicon layer 55 which will form the lower electrodes of the capacitors is deposited by CVD to a thickness of tens of nm to a 100 or so nm. A silicon oxide layer is deposited by CVD to a thickness of tens of nm to bury the memory node grooves NH and is etched back to form side walls of the inner walls of the memory node grooves NH. An impurity-doped polycrystalline silicon layer 56 is deposited by CVD to a thickness of tens of nm to hundreds of nm and a silicon oxide layer 75 is deposited by CVD to a thickness of hundreds of nm.

The polycrystalline silicon layer 56 is exposed by etching back the silicon oxide layer 75. Then, the polycrystalline silicon layer 56 and the polycrystalline silicon layer 55 are etched by reactive ion etching with a high selectivity ratio with respect to the silicon oxide so as to expose the surface of the edges of the side walls 74.

Figure 4G:
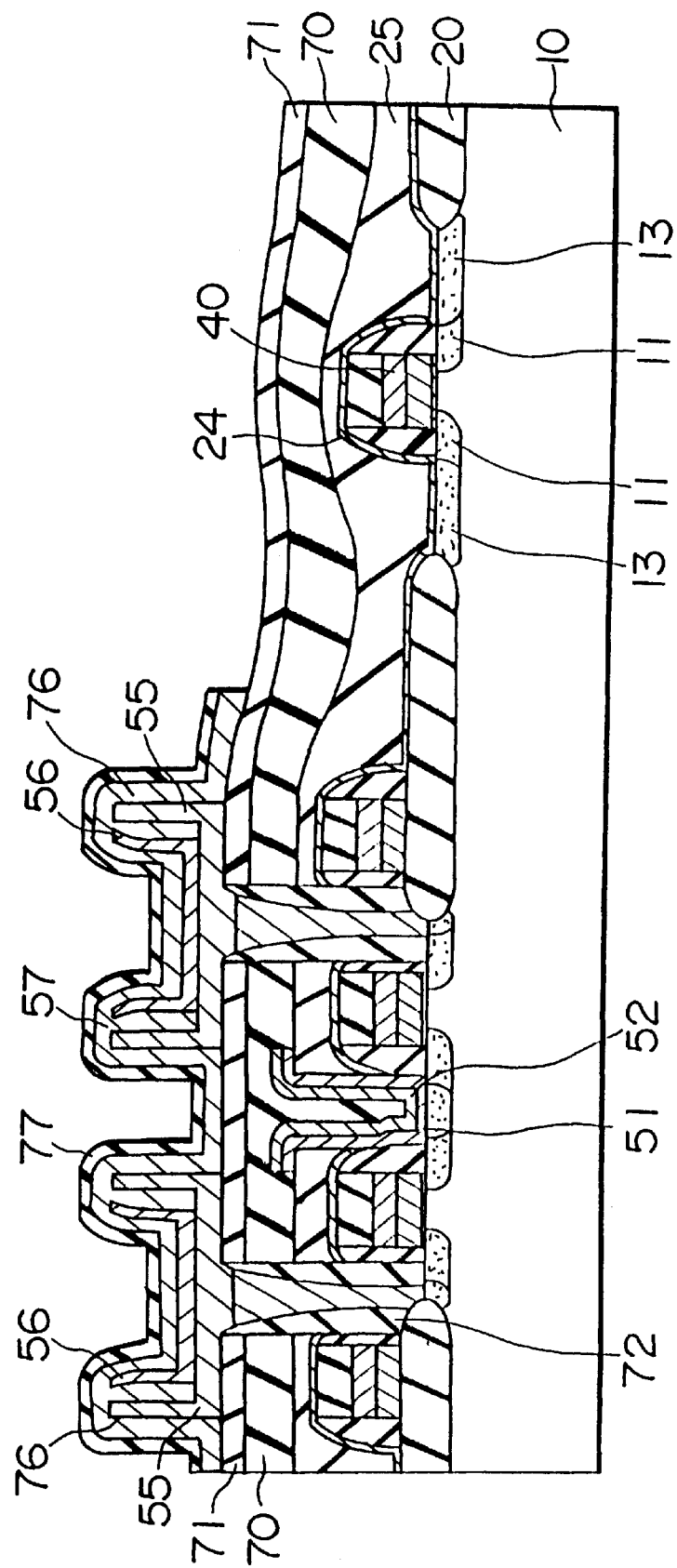
FIG. 4G is a sectional view of a process of manufacturing a semiconductor device of the second embodiment of the present invention after the step of FIG. 3F.

Then, as shown in FIG. 4G, the remaining silicon oxide layer 75, the silicon oxide layer 73, and the side walls 74 which is composed of silicon oxide are etched off with a dilute hydrofluoric acid solution using the silicon nitride layer 71 as an etching mask so as to complete double cylinder type memory nodes. Next, the surface of the impurity-doped polycrystalline silicon layers 55 and 56 are annealed with a lamp annealer in an atmosphere of N2 gas. Next, a silicon nitride layer is deposited by CVD to a thickness of several nm and the silicon nitride layer is then oxidized to form a dielectric layer 76 composed of ONO, that is, a silicon oxide layer/silicon nitride layer/silicon oxide layer. Further, an impurity-doped polycrystalline silicon layer 57 is deposited by CVD to a thickness of tens of nm to hundreds of nm. A polycrystalline silicon oxide layer or polycrystalline silicon nitride layer 77 is deposited by CVD to a thickness of hundreds of nm . Then, plate electrodes are formed by patterning the polycrystalline silicon layer 57 and insulating layer 77 by photolithography. Alternatively, after forming the plate electrodes by patterning the impurity-doped polycrystalline silicon layer 57, a silicon nitride layer or silicon oxide layer 77 may be deposited by CVD to a thickness of hundreds of nm so as to complete the DRAM as seen in FIG. 4G.

Figure 4H:
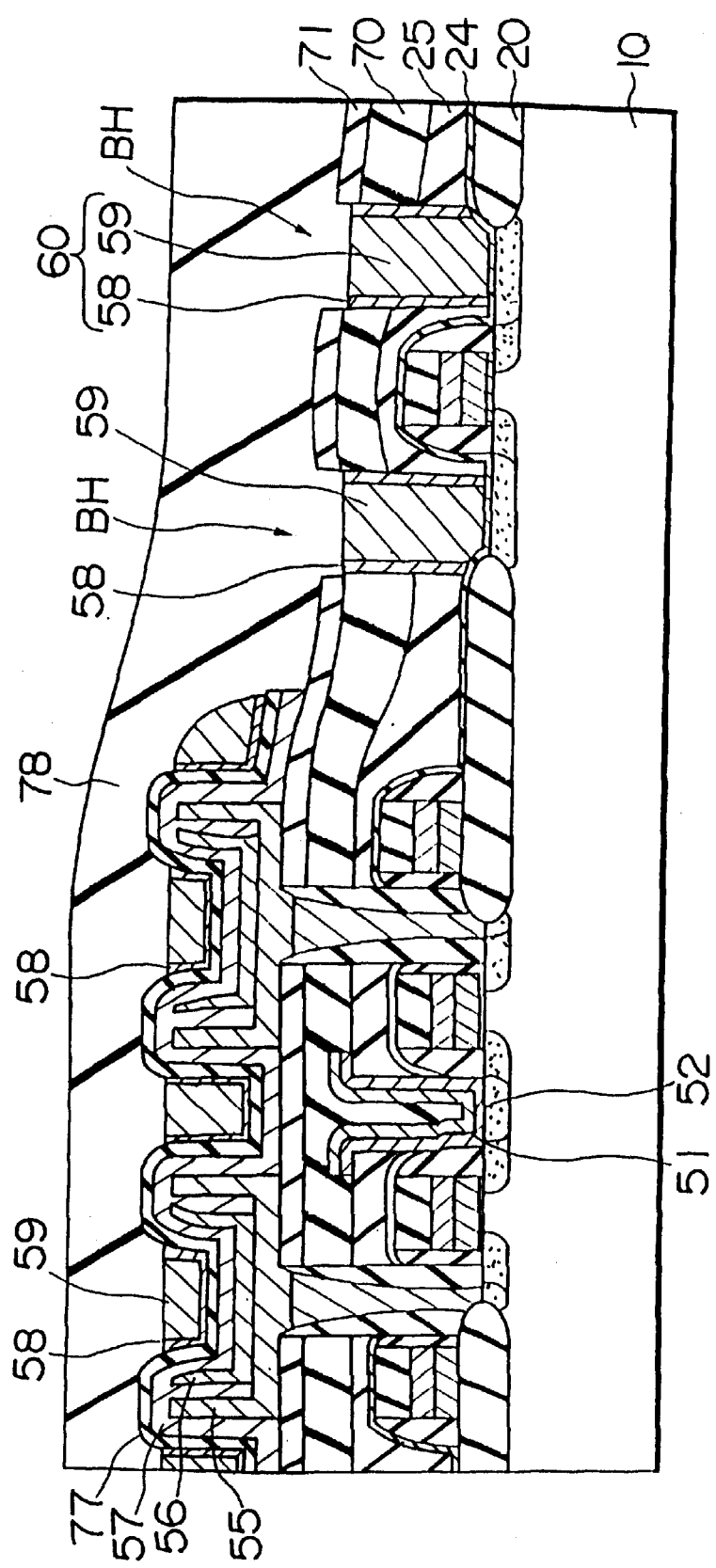
FIG. 4H is a sectional view of a process of manufacturing a semiconductor device of the second embodiment of the present invention after the step of FIG. 3G.

The next process is to form a covering conductive layer on the diffusion regions of the MOS transistors in the peripheral circuit. As shown in FIG. 4H, the silicon nitride layer 71, the silicon oxide layer 70, the silicon oxide layer 25, and the silicon nitride layer 24 which cover the MOS transistors in the logic circuit are etched successively so as to make holes BH which reach the surface of the diffusion regions on the substrate. A Ti layer and TiN layer are deposited as bonding layers by sputtering or CVD and a tungsten layer is formed by CVD. Then, these bonding layers and tungsten layer are etched back by reactive ion etching, so that the holes BH for the buried conductive layer are filled with tungsten plugs 59, whereby a burying metal layer, that is, the covering conductive layer 60, is formed. Instead of etching back, chemical mechanical polishing is allowable. Then, the silicon oxide layer 78 which is to serve as the interlayer insulating layer is formed by CVD to a thickness of hundreds of nm and is flattened by chemical mechanical polishing.

Figure 4I:
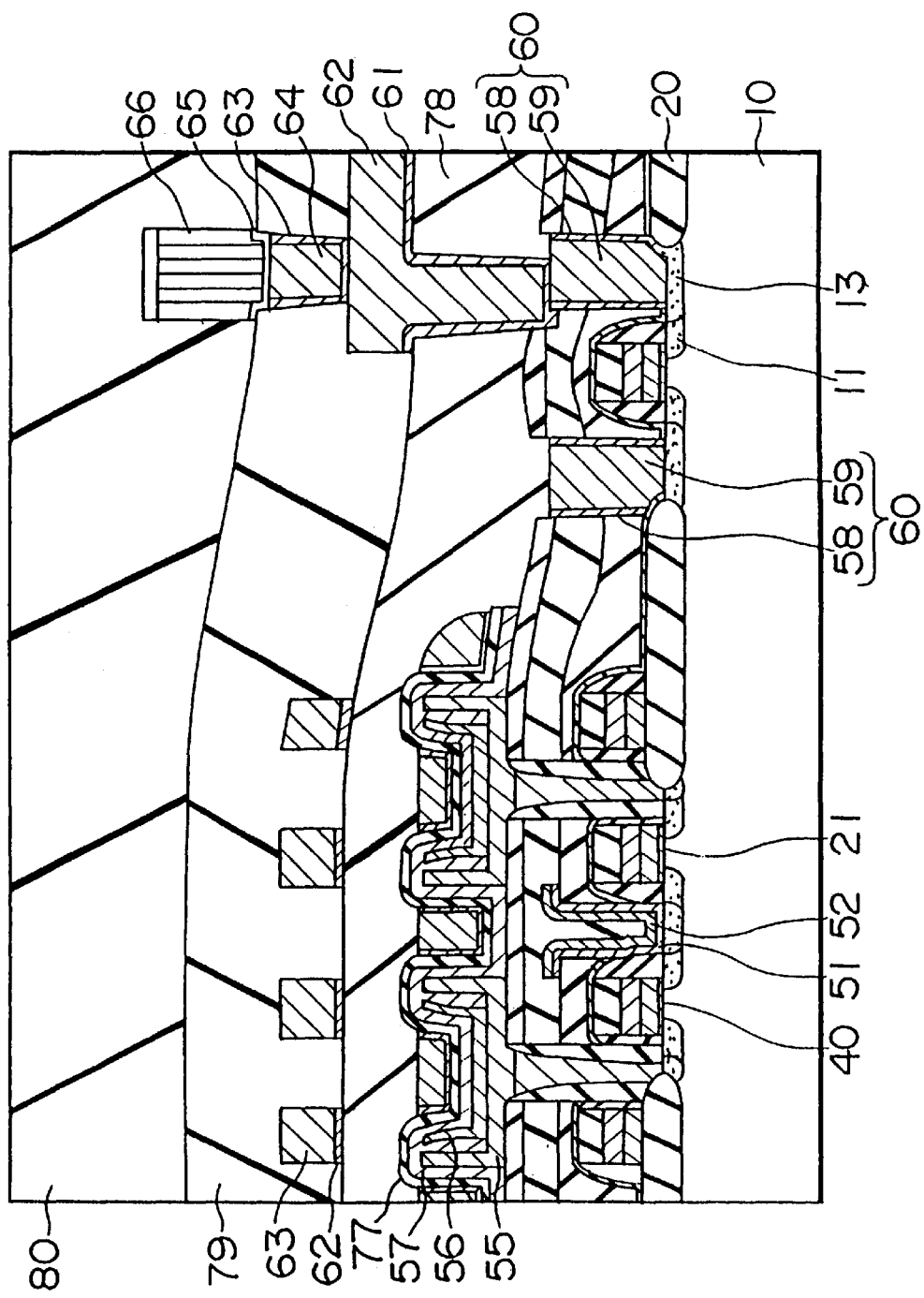
FIG. 4I is a sectional view of a process of manufacturing a semiconductor device of the second embodiment of the present invention after the step of FIG. 3H.

Finally, as shown in FIG. 4I, contact holes are formed in the interlayer insulating layer 78, a TiN layer 61 is formed by sputtering to a thickness of tens of nm, a tungsten layer 62 is deposited by CVD, and these layers 78 and 61 are patterned to form the tungsten interconnections. Next, an interlayer insulating layer 79 is deposited, then via holes are formed. The via holes is buried by the TiN layer 63 and tungsten plugs 64. Aluminum interconnections are formed by patterning a TiN layer 65 and a AlCu or AlSiCU layer 66. Again, an interlayer insulating layer 80 is formed by the same method as described above. By repeating these steps, multilayer interconnections are formed.

According to the second embodiment, the covering conductive layer 60 is not formed on the diffusion regions of the memory cells, but only formed on those of the peripheral circuit. Therefore, a low resistance and consequent high processing speed of a circuit such as a logic circuit in the peripheral circuit are achieved and good retention in the DRAM is secured. Since the covering conductive layer and the bit lines are formed before forming the capacitors and after forming the memory cells, where heat treatment is needed, the heat treatment performed when forming the bit lines does not affect the covering conductive layer, the semiconductor device is free from the effects of the heat treatment, and the resistance is low.

Figure 5:
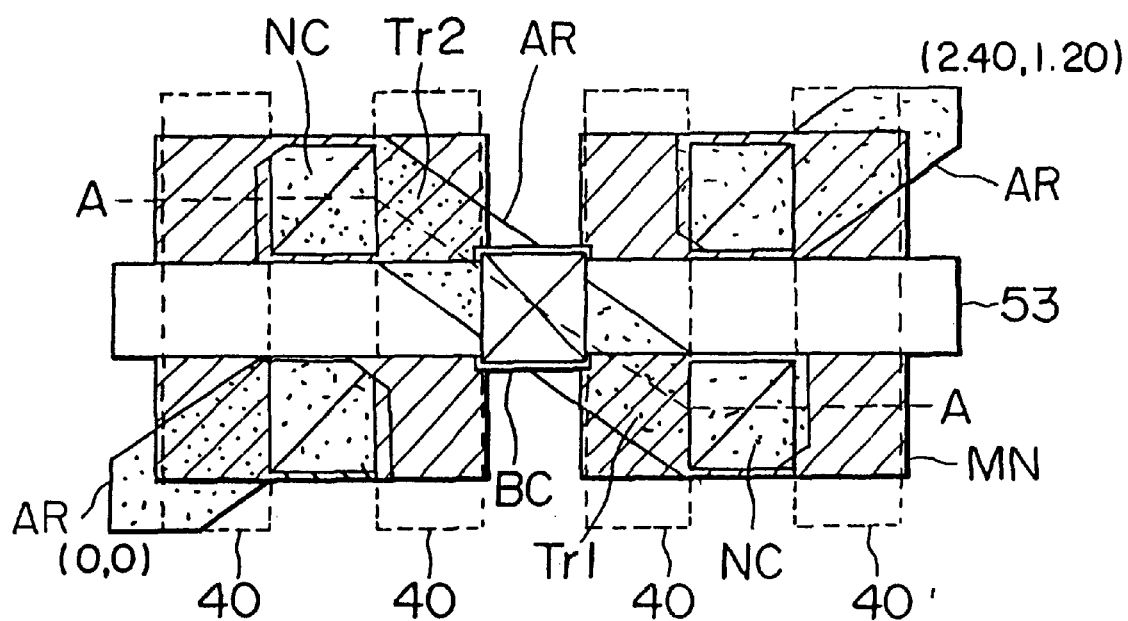
FIG. 5 is a plan view of a DRAM in the second embodiment.

FIG. 5 is a plan view of DRAM cells of such a one-chip DRAM. FIG. 4E corresponds to a cross-section of the device of FIG. 5 taken along the line A—A in FIG. 5. As shown in FIG. 5, four parallel gate electrodes 40 are interconnected. The first transistor Tr1 and second transistor Tr2 are composed of an activated region AR and gate electrode 40. The bit line 53 and gate electrode 40 cross each other at a right angle. The bit line 53 is connected to the common diffusion region of the first transistor Tr1 and the second transistor Tr2 through the bit contact BC. The memory node MN over the bit line 53 is connected to the diffusion region of the transistor through the node contact NC. The memory cell has a size of 1.2×0.6=0.72 $\mu m^2$. The number of cells is for example 5000.

Figure 6:
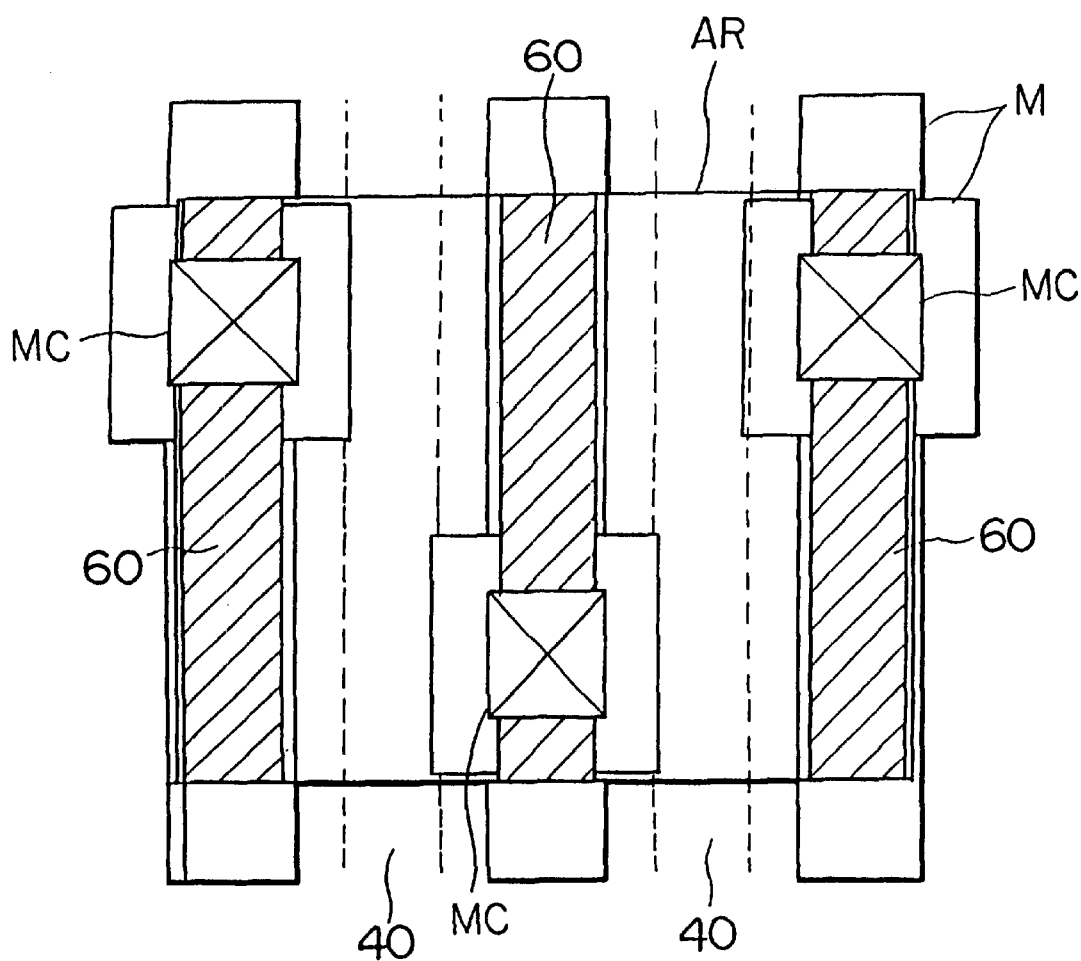
FIG. 6 is a plan view of a transistor of a logic circuit.
Figure 7:
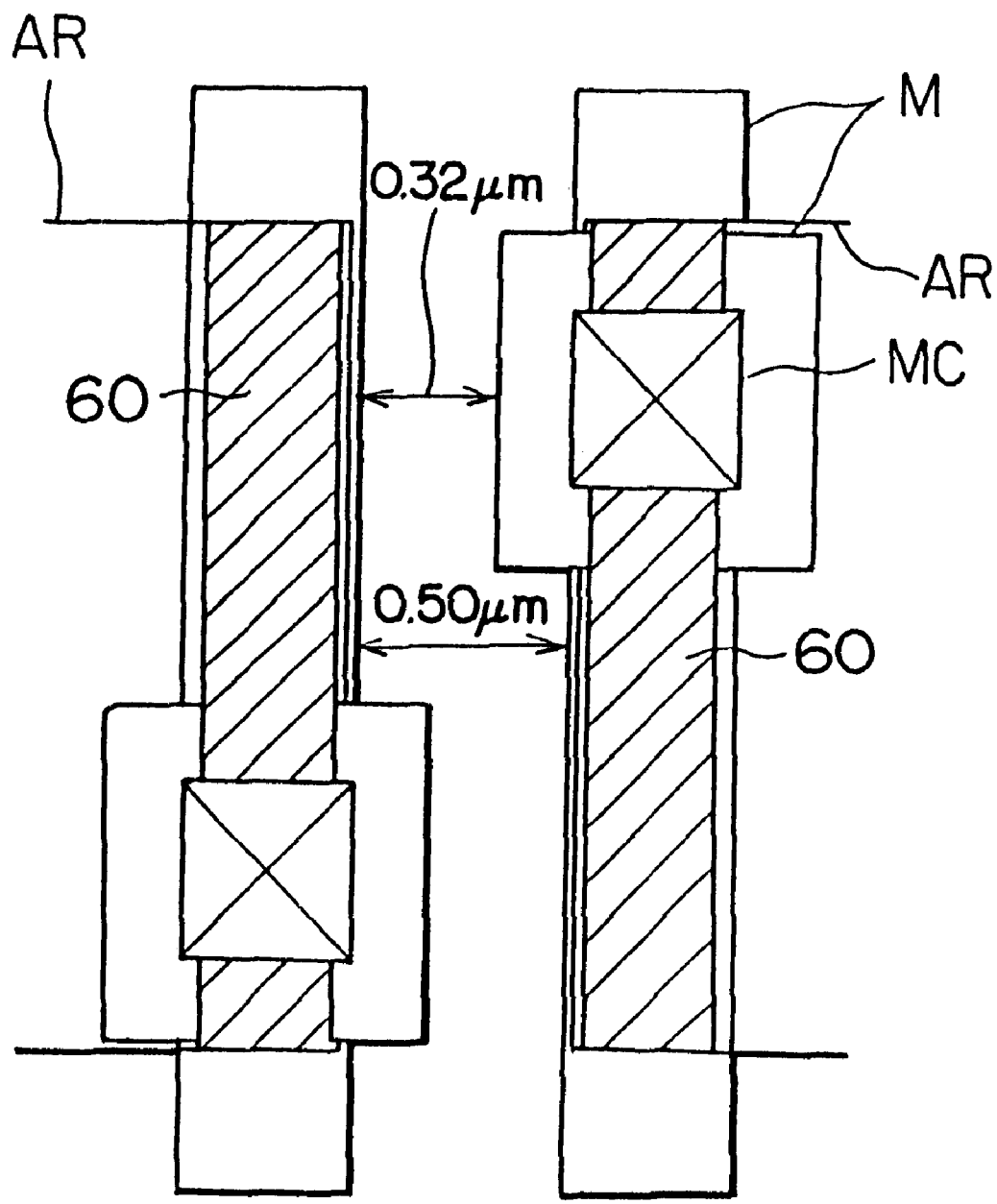
FIG. 7 is a plan view of a activated area of a logic circuit.

FIG. 6 is a plan view of a transistor in a logic circuit area. This figure shows a state where the majority of the area of the diffusion region of the transistor is covered by forming a buried metal layer 60 over the diffusion region. The transistor is composed of a gate electrode 40 and activated region AR. This buried metal layer 60 is connected to a tungsten interconnection or aluminum interconnection M through a contact hole MC. FIG. 7 shows an activated region isolated from the field region. It is designed so that the distance between activated regions is 0.50 $\mu m$ and the distance between a tungsten interconnection and activated region is 0.32 $\mu m$.

In the second embodiment, the grooves were completely buried by a metal, but it is also possible to form a silicide on the exposed diffusion regions by depositing a metal such as titanium and causing a reaction and then filling with tungsten plugs.

While this invention has been described with reference to the illustrated embodiments, this description is not intended to be construed in a limiting sense. Various modifications of the illustrated embodiments, such as semiconductor memory devices other than the DRAM as explained above like a FeRAM or an SRAM having a capacitor, are also possible.

What is claimed is:

1. A process of production of a semiconductor memory device having a memory array including memory cells and a peripheral circuit on one substrate comprising:

forming an interlayer insulating layer covering said memory array and peripheral circuit;

forming said memory cells;

exposing a surface of diffusion regions in the peripheral circuit after forming said memory cells;

forming a covering conductive layer on the exposed surface of the diffusion regions in the peripheral circuit; and flattening by chemical mechanical polishing.

2. A process of production of a semiconductor memory device according to claim 1, wherein said memory cells have capacitors.

3. A process of production of a semiconductor memory device according to claim 1, wherein the covering conductive layer is formed by reacting a refractory metal and a semiconductor material.

4. A process of production of a semiconductor memory device according to claim 1, wherein the covering conductive layer is formed by depositing a refractory metal.

5. A process of production of a semiconductor memory device having a memory array including memory cells and a peripheral circuit on one substrate comprising:

forming an interlayer insulating layer covering said memory array and peripheral circuit;

forming said memory cells;

forming a photoresist layer covering said memory cells;

etching back the interlayer insulating layer covering said peripheral circuit using said photoresist layer as a mask; and flattening by chemical mechanical polishing.

6. A process of production of a semiconductor memory device having a memory array including memory cells and a peripheral circuit on one substrate comprising:

forming an interlayer insulating layer covering said memory array and peripheral circuit;

forming said memory cells having capacitors to be composed of electrodes;

etching back the interlayer insulating layer covering said peripheral circuit using the electrodes of the capacitors as a mask; and flattening by chemical mechanical polishing.

7. A process of production of a semiconductor memory device according to claim 5 or 6, wherein side walls on sides of gate electrodes of MOS transistors in the peripheral circuit are formed by etching back the interlayer insulating layer covering said peripheral circuit.

8. A process of production of a semiconductor memory device having a memory array including memory cells and a peripheral circuit on one substrate comprising:

forming an interlayer insulating layer covering said memory array and peripheral circuit;

forming said memory cells;

exposing a surface of diffusion regions in the peripheral circuit after forming said memory cells by forming holes in said interlayer insulating layer;

forming a covering conductive layer on the exposed surface of the diffusion regions by burying said holes with a conductor; and flattening by chemical mechanical polishing.

* * * * *